United States Patent
Yang et al.

(10) Patent No.: US 9,799,755 B2
(45) Date of Patent: Oct. 24, 2017

(54) METHOD FOR MANUFACTURING MEMORY DEVICE AND METHOD FOR MANUFACTURING SHALLOW TRENCH ISOLATION

(71) Applicant: TAIWAN SEMICONDUCTOR MANUFACTURING CO., LTD., Hsinchu (TW)

(72) Inventors: Tsung-Yu Yang, Tainan (TW); Cheng-Bo Shu, Tainan (TW); Chung-Jen Huang, Tainan (TW); Jing-Ru Lin, Kaohsiung (TW); Jui-Yu Pan, Pingtung County (TW); Yun-Chi Wu, Tainan (TW); Yueh-Chieh Chu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/265,506

(22) Filed: Sep. 14, 2016

(65) Prior Publication Data
US 2017/0278953 A1    Sep. 28, 2017

Related U.S. Application Data

(60) Provisional application No. 62/313,673, filed on Mar. 25, 2016.

(51) Int. Cl.
*H01L 29/66* (2006.01)
*H01L 21/33* (2006.01)
(Continued)

(52) U.S. Cl.
CPC .... *H01L 29/66833* (2013.01); *H01L 21/2633* (2013.01); *H01L 21/3065* (2013.01);
(Continued)

(58) Field of Classification Search
CPC combination set(s) only.
See application file for complete search history.

(56) References Cited

U.S. PATENT DOCUMENTS

| | | | |
|---|---|---|---|
| 7,342,280 B2 | 3/2008 | Yoo | |
| 7,714,379 B2 * | 5/2010 | Lee | H01L 27/115 257/324 |

(Continued)

*Primary Examiner* — Mamadou Diallo
(74) *Attorney, Agent, or Firm* — McDermott Will & Emery LLP (57) ABSTRACT

A method for manufacturing a memory device includes forming trenches in a substrate to define an active region, filling an insulation material in the trenches, treating at least one portion of the insulation material, removing an upper portion of the insulation material from the trenches, so as to expose upper portions of side surfaces of the active region and to convert remaining portions of the insulation material in the trenches to shallow trench isolation (STI) disposed on opposite sides of the active region, forming a lower oxide layer, a middle charge trapping layer, and an upper oxide layer which cover the exposed upper portions of the side surfaces of the active region, an upper surface of the active region between the side surfaces of the active region, and the STI, and forming a gate layer on the upper oxide layer.

18 Claims, 7 Drawing Sheets

(51) Int. Cl.
*H01L 29/792* (2006.01)
*H01L 21/3115* (2006.01)
*H01L 21/3065* (2006.01)
*H01L 21/311* (2006.01)
*H01L 21/263* (2006.01)
*H01L 21/3105* (2006.01)
*H01L 21/32* (2006.01)
*H01L 21/762* (2006.01)

(52) U.S. Cl.
CPC .... *H01L 21/3105* (2013.01); *H01L 21/31105* (2013.01); *H01L 21/31155* (2013.01); *H01L 21/32* (2013.01); *H01L 21/76224* (2013.01); *H01L 29/792* (2013.01)

(56) References Cited

U.S. PATENT DOCUMENTS

| | | | |
|---|---|---|---|
| 7,838,923 B2 | 11/2010 | Lue | |
| 7,910,453 B2 | 3/2011 | Xu et al. | |
| 8,592,915 B2 | 11/2013 | Huang et al. | |
| 2004/0009645 A1* | 1/2004 | Yoo | H01L 21/28282 438/315 |
| 2004/0102005 A1* | 5/2004 | Dong | H01L 21/3211 438/257 |
| 2007/0111447 A1* | 5/2007 | Cremonesi | H01L 27/115 438/261 |
| 2009/0159959 A1* | 6/2009 | Park | H01L 27/11565 257/324 |
| 2015/0115346 A1* | 4/2015 | Hsu | H01L 27/11521 257/317 |

* cited by examiner

METHOD FOR MANUFACTURING MEMORY DEVICE AND METHOD FOR MANUFACTURING SHALLOW TRENCH ISOLATION

PRIORITY CLAIM AND CROSS-REFERENCE

This application claims priority to U.S. Provisional Application No. 62/313,673 filed Mar. 25, 2016, entitled "METHOD FOR MANUFACTURING SILICON-OXIDE-NITRIDE-OXIDE-SILICON MEMORY," the entire disclosure of which is incorporated herein by reference.

TECHNICAL FIELD

The present disclosure is related to a method for manufacturing a memory device and a method for manufacturing shallow trench isolation (STI).

BACKGROUND

Silicon-Oxide-Nitride-Oxide-Silicon (SONOS) memory is one type of non-volatile memory. An SONOS memory cell can be formed from a metal-oxide-semiconductor field-effect transistor (MOSFET) with an additional silicon nitride layer inserted in the transistor's gate oxide layer and thus has an Oxide-Nitride-Oxide (ONO) layer including a lower silicon oxide layer, a middle silicon nitride layer, and an upper oxide layer sequentially stacked on one another on a channel of the transistor. Since a silicon nitride layer contains a large number of charge trapping sites able to hold electrostatic charges, the conductivity of the channel can be regulated by an amount of electrons trapped in the silicon nitride layer of the ONO layer.

When a positive control signal is applied to a gate electrode of the transistor, electrons traveling between the source and drain regions of the transistor may tunnel through the lower oxide layer of the ONO layer and be trapped in the silicon nitride of the ONO layer, resulting in an energy barrier between the drain and source regions. Thus, a threshold voltage Vth of the transistor may be increased (e.g., programming). On the other side, when a negative control signal is applied to the gate electrode, the trapped electrons can be released to lower the threshold voltage Vth (e.g., erasing). After programming or erasing the SONOS memory cell, a controller of the SONOS memory can determine the state of the SONOS memory cell by applying a small voltage across the source and drain regions of the transistor. If the controller detects that current greater than a predetermined value flows through the source and drain electrodes, the controller determines that the SONOS memory cell is in a state without any trapped electrons (or with a small amount of trapped electrons but less than a reference number) in the silicon nitride layer, which is considered as, for example, a logical value "1." If the controller detects that current less than the predetermined value flows through or no current flows through the source and drain electrodes, the controller determines that the SONOS memory cell is in a state with trapped electrons in the silicon nitride layer, which is considered as, for example, a logical value "0."

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In this disclosure, an oxide layer refers to a non-native oxide layer and is formed by an engineering method.

One of ordinary skill in the art should recognize that in this disclosure, an etching rate of drying etching or wet etching of a target material or layer is significantly faster than a hardmask or protection layer. One of ordinary skill in the art should also recognize that an etching method such as reactive ion etching (RIE) can etch different target materials at different etching speeds by suitable or modified etching recipes, even though the terminology such as RIE is described to etch various target materials or layers in this disclosure. Similarly, one of ordinary skill in the art should understand that even though the same terminology such as chemical vapor deposition (CVD) is described to deposit or grow various target materials or layers, the deposition or growth of various target materials or layers can be controlled by the process conditions including, but not limited to, temperature, source materials, pressure, etc.

"About" used in this disclosure to describe a time period, thickness, depth, concentration, etc., means that measurement errors and/or manufacturing margins have been considered to describe the time period, the thickness, the depth, the concentration, etc. Such expressions should be recognizable to one of ordinary skill in the art.

Figure 1A:
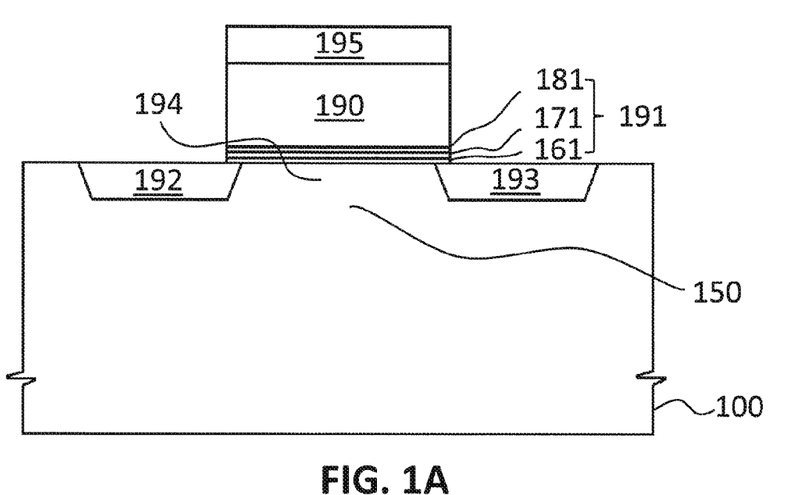
FIGS. 1A and 1B are cross-sectional views of a memory cell, taken along a bit line and a gate line, respectively, according to embodiments of the present disclosure.
Figure 1B:
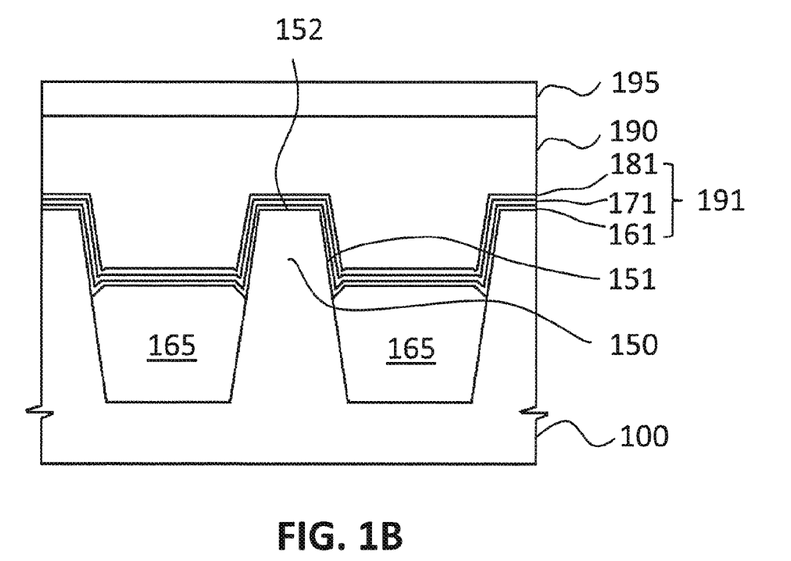

FIGS. 1A and 1B are cross-sectional views of a memory cell, taken along a bit line and a gate line, respectively, according to embodiments of the present disclosure.

Referring to FIGS. 1A and 1B, a memory cell is formed in a substrate 100 having an active region 150 confined by shallow trench isolation (STI) 165 disposed on opposite sides of the active region 150. The substrate 100 may be a silicon substrate or a silicon-on-insulator (SOI) substrate. Alternatively, the substrate 100 may be a germanium or silicon germanium substrate. In other embodiments, the substrate 100 may use other materials, such as diamond, silicon carbide, gallium arsenide, GaAsP, AlInAs, AlGaAs, GaInP, or combination thereof. In some embodiments, the substrate 100 may include an epitaxy layer, such as, but not limited to, a silicon epitaxy layer.

The memory cell includes source and drain regions 192 and 193 and a channel 194 therebetween. An oxide-nitride-oxide (ONO) layer 191 includes a lower oxide layer 161, a middle nitride layer 171, and an upper oxide layer 181 sequentially stacked on the channel 194. The lower oxide layer 161 is a tunnel oxide layer, the middle nitride layer 171 is a storage layer in which charges such as electrons can be trapped to store data, and the upper oxide layer 181 is a blocking layer for preventing the loss of stored charges in the middle nitride layer 171. A gate electrode layer 190 can be formed on the ONO layer 191.

Referring to FIG. 1B, the ONO layer 191 of the memory cell according to embodiments of the present disclosure not only covers an upper surface 152 of the active region 150 but also covers upper portions of side surfaces 151 of the active region 150. Since the gate electrode layer 190 also covers the portions of the ONO layer 191 formed on the side surfaces 151, the effective area of the middle nitride layer 171 interposed between the gate electrode layer 190 and the active region 150 for holding trapped charges is increased, thereby increasing a margin between program Vth and erase Vth of the memory cell. Thus, the memory cell according to embodiments of the present disclosure can have an increased operation window due to the increased margin between program Vth and erase Vth, comparing to a comparative example in which a surface of STI is flush to an upper surface of an active layer such that an ONO layer is a planar layer not overlapping any portions of side surfaces of the active layer or comparing to another comparative example in which a surface of STI is slightly below an upper surface of an active layer such that an ONO layer only overlap a relatively smaller portions of side surfaces of the active region. In other words, due to an increased effective area of the middle nitride layer 171 between the active region 150 and the gate electrode 190 allowing more charges to be trapped therein, the memory cell according to embodiments of the present disclosure has an increased operation window.

As shown in FIGS. 1A and 1B, the active region 150 is a region in which the channel 194 and source and drain regions 192 and 193 of the memory cell are formed and is defined by the STI 165. The upper portions of the side surfaces 151 of the active region 150 are exposed from the STI 165 to increase an overlapped area between the active region 150 and the ONO layer 191, but without increasing an area (cell size) in the substrate 100 to manufacture the memory cell. These features will be more apparent with reference to FIGS. 2-12.

According to some embodiments, the substrate 100 is a silicon based substrate, the lower oxide layer 161 is a silicon oxide layer, the middle nitride layer 171 is a silicon nitride layer, the upper oxide layer 191 is a silicon oxide layer, and the gate electrode layer 190 is a polysilicon layer. Thus, stacked layers constituting major elements of the memory cell have a silicon-oxide-nitride-oxide-silicon (SONOS) structure and thus the memory cell is an SONOS memory cell. In this case, the memory cell can optionally include a silicide layer 195 disposed on the gate electrode layer 190.

One of ordinary skill in the art should recognize that a nitride layer in an ONO layer as a charge trapping or storage layer is an example which will be described in this disclosure. According to some embodiments, the charge trapping or storage layer may be made of any other material such as, but not limited to, polysilicon. According to other embodiments, a high-k dielectric material may be optionally disposed among the lower oxide layer, the middle charge trapping or storage layer, and the upper oxide layer.

FIGS. 2-12 are cross-sectional views illustrating a method of manufacturing a memory cell according to embodiments of the present disclosure. The cross-sectional views in FIGS. 2-12 are taken along a direction of a gate line.

Figure 2:
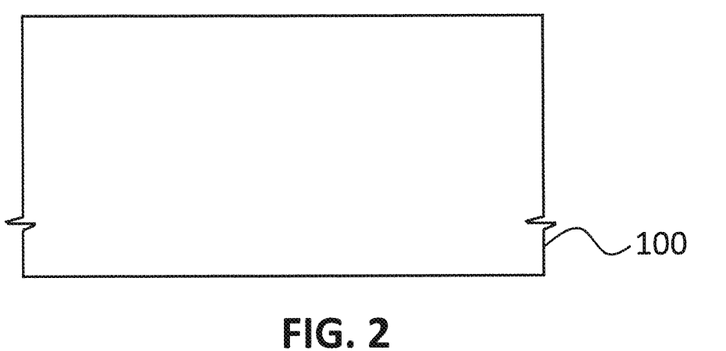
FIGS. 2-12 are cross-sectional views illustrating a method of manufacturing a memory cell according to embodiments of the present disclosure.

As shown in FIG. 2, a substrate 100 is first prepared. The substrate 100 may be a silicon substrate or a silicon-on-insulator (SOI) substrate. Alternatively, the substrate 100 may be a germanium or silicon germanium substrate. In other embodiments, the substrate 100 may use other semiconductor materials, such as diamond, silicon carbide, gallium arsenide, GaAsP, AlInAs, AlGaAs, GaInP, or combination thereof. Although not shown, the preparation of the substrate 100 may optimally include growing an epitaxy layer, such as a silicon epitaxy layer.

Figure 3:
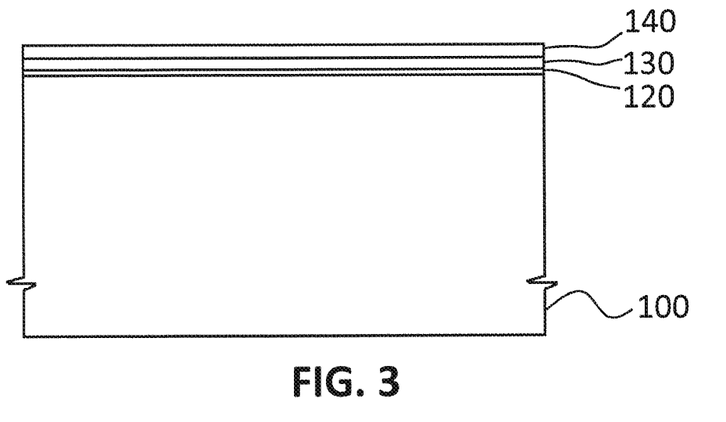

Referring to FIG. 3, a pad oxide layer 120 such as a silicon oxide layer is formed, for example, by thermal oxidation, chemical vapor deposition (CVD), low-pressure CVD (LPCVD), or plasma-enhanced CVD (PECVD). A first hardmask layer 130 which may be a nitride layer such as a silicon nitride layer is deposited by CVD, LPCVD, or PECVD. The first hardmask layer 130 serves as a protection layer protecting an active region during a subsequent STI formation process and also serves as a polishing stop material during a subsequent chemical mechanical planarization (CMP) process. Optionally, a second hardmask layer 140 may be additionally formed on the first hardmask layer 130 to also serve as a hardmask layer in a subsequent etching process to form the active region. The second hardmask layer 140 can be a silicon oxynitride layer or a silicon oxide layer formed by CVD, LPCVD, or PECVD.

Figure 4:
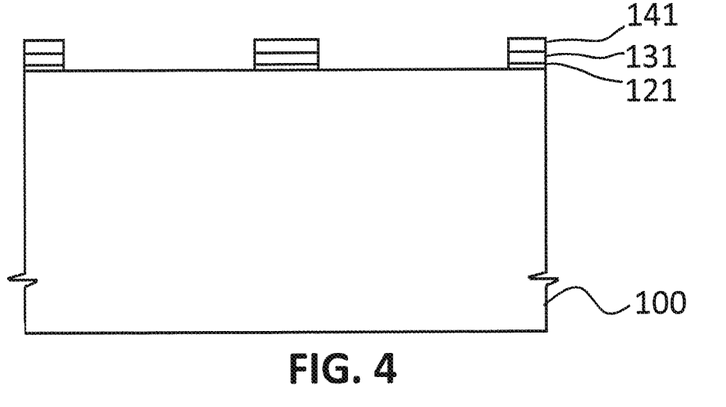

Next, as shown in FIG. 4, the stacked layers including the second hardmask layer 140, the first hardmask layer 130, and the pad oxide layer 120 are patterned, for example, by photolithography followed by wet or dry etching processes, such that the stacked second hardmask layer 140, first hardmask layer 130, and pad oxide layer 120 are converted to a patterned oxide layer 121, a patterned first hardmask layer 131, and a patterned second hardmask layer 141, respectively. Thus, regions in the substrate 100 for forming an active region and STI are respectively defined.

Figure 5:
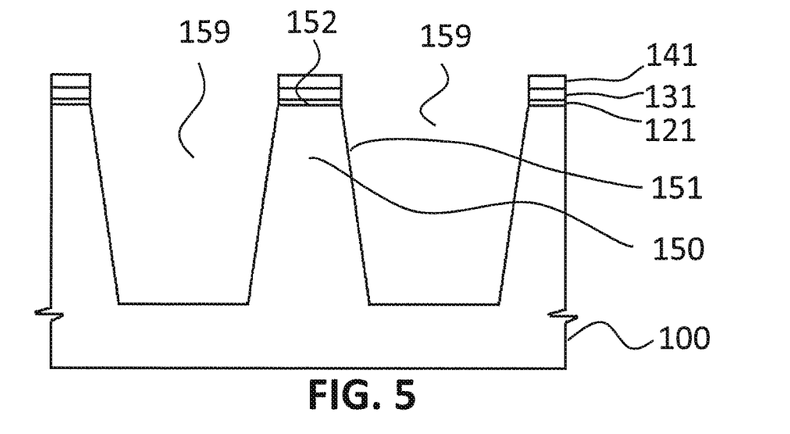

Thereafter, as shown in FIG. 5, exposed portions of the substrate 100 by the patterned oxide layer 121, the patterned first hardmask layer 131, and the patterned second hardmask layer 141 are etched, for example, by dry etching such as reactive-ion etching (RIE) or by wet etching using a liquid substrate etchant. Here, the patterned second hardmask layer 141, together with the patterned first hardmask layer 131 and the patterned oxide layer 121, acts as a hardmask in the substrate etching process to form STI trenches 159 in the substrate 100. Consequently, an active region 150, which may have a stripe shape extending in a bit line direction, is defined.

Although side surfaces 151 of the active region 150 corresponding to sidewalls of the STI trenches 159 in FIG. 5 are not perpendicular to an upper surface 152 of the active region 150, one of ordinary skill in the art should understand that the side surfaces 151 of the active region 150 can be formed perpendicularly to the upper surface 152 of the active region 150, when a unidirectional vertical etching is performed to form the STI trenches 159.

Figure 6:
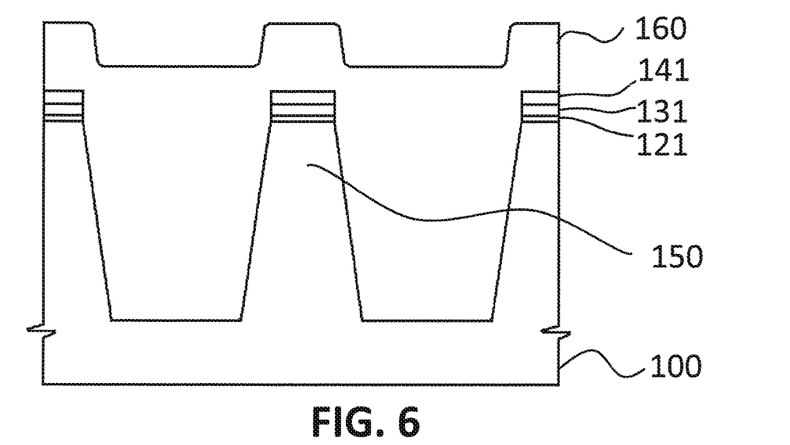

Now referring to FIG. 6, an electrically insulating layer 160 is blanket-deposited to fill at least the STI trenches 159. The electrically insulating layer 160 can also cover an upper surface of the stacked structure including the patterned oxide layer 121, the patterned first hardmask layer 131, and the patterned second hardmask layer 141. The electrically insulating layer 160 may be one or more layers of silicon oxide, silicon dioxide, carbon doped silicon dioxide, nitrogen doped silicon dioxide, germanium doped silicon dioxide, phosphorus doped silicon dioxide, or combination thereof. One skilled in the art should understand that other insulation materials may be employed to fill the STI trenches 159 so long as the other insulation materials can serve a purpose of electrically isolating adjacent active regions 150. The electrically insulating layer 160 can be a single layer as shown in FIG. 6 or alternatively include multiple layers. The electrically insulating layer 160 may be conformably formed by CVD, LPCVD, PECVD, or combination thereof, although the present disclosure is not limited thereto. After the electrically insulating layer 160 is formed, the substrate 100 can optimally undergo an annealing process in a furnace or a rapid thermal processing (RTP) chamber to densify the electrically insulating layer 160.

Although not shown in the drawings, an electrically insulating liner layer lining surfaces of the STI trenches 159 can be optionally formed prior to forming the electrically insulating layer 160. If the substrate 100 is a silicon substrate, the electrically insulating liner layer may be formed by thermal oxidation such that damage caused by etching to form the STI trenches 159 may be repaired and thermally induced stresses at the surfaces of the STI trenches 159 may be reduced. In a case in which the substrate 100 is not a silicon substrate, for example, a GaAs substrate, the electrically insulating liner layer may be formed, for example, by LPCVD.

Figure 7:
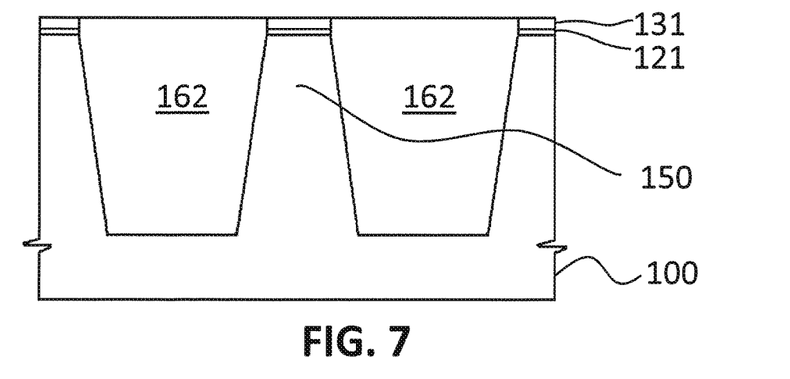

After forming the electrically insulating layer 160 which at least fills the STI trenches 159, a global planarization process such as a chemical mechanical polishing (CMP) process is performed to remove excessive portions of the electrically insulating layer 160 outside the STI trenches 159. As shown in FIG. 7, after the excessive portions of the electrically insulating layer 160 are removed by the CMP process using the first hardmask layer 131 as a polishing stop layer, the remaining electrically insulating layer 160 is converted to temporary STI 162 filling the STI trenches 159 (shown in FIG. 5). Since the CMP process using the first hardmask layer 131 as a polishing stop layer, the temporary STI 162 is flush to a surface of the first hardmask layer 131 and the patterned second hardmask layer 141 is removed, once the CMP process completes.

Figure 8:
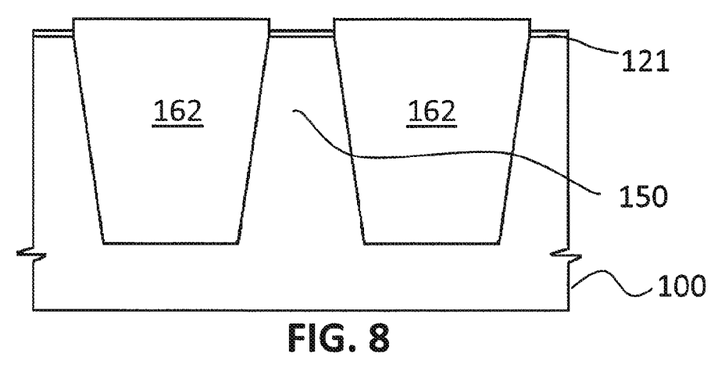

Thereafter, as shown in FIG. 8, the first hardmask layer 131 is removed.

Figure 9:
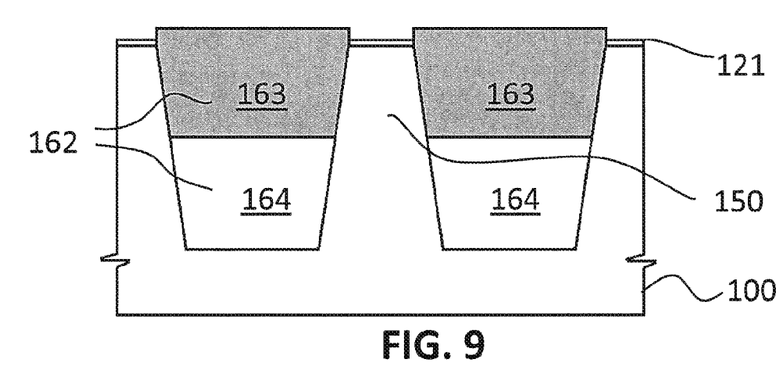

Now referring to FIG. 9, an ion implantation process is performed after the removal of the first hardmask layer 131 such that dopants including In, Sn, Sb, Te, or a combination thereof are doped at least in an upper portion 163 of the temporary STI 162. The patterned oxide layer 121 covering the active region 150 serves as a doping (or implantation) sacrificial layer to protect the active region 150 from being damaged, since the dopants used here may otherwise affect Vt of devices formed in the affected regions in the active region 150. The doping (or implantation) may be performed by ion beams or by plasma implantation, although the present disclosure is not limited thereto.

Still referring to FIG. 9, by the ion implantation, the temporary STI 162 is converted to two portions, the upper portion 163 containing dopants including In, Sn, Sb, Te, or a combination thereof and a lower portion 164, i.e., the remaining portion of the temporary STI 162. The lower portion 164 contains no dopants including In, Sn, Sb, Te, or a combination thereof or contains negligible dopants including In, Sn, Sb, Te, or a combination thereof comparing to the upper portion 163.

In some embodiments, the order of the processes respectively shown in FIGS. 8 and 9 to remove the first hardmask layer 131 and implant ions into the temporary STI 162 can be reversed.

Figure 10:
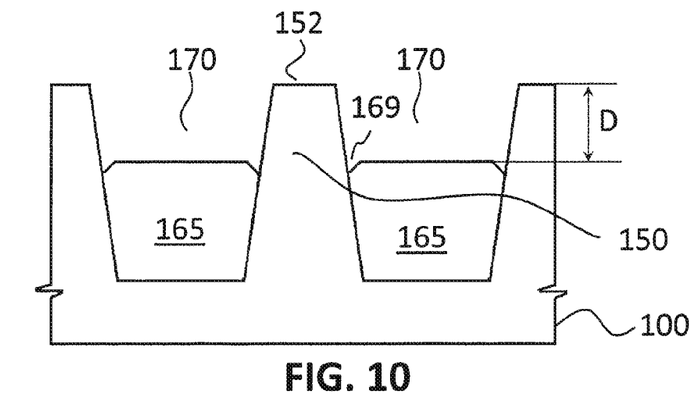

An annealing process performed, for example, at a temperature of 500° C. to 700° C., usually follows an ion implantation process in manufacturing a semiconductor device. However, in the present disclosure, no annealing process is performed right after the ion implantation process as shown in FIG. 9 to maintain the coarser STI upper portion 163, such that the upper portion 163 will be easily removed as described below with reference to FIG. 10. Next, as shown in FIG. 10, a portion of the temporary STI 162 exposed to exterior is removed by dry or wet etching or combination thereof. Here, the patterned oxide layer 121 will be simultaneously removed during such an etching process.

Referring to FIGS. 9 and 10, according to some embodiments, the doped upper portion 163 of the temporary STI 162 is removed and corner portions 169 of the undoped lower portion 164 of the temporary STI 162 are also removed by dry or wet etching or combination thereof. In this case, the remaining undoped lower portion 164 of the temporary STI 162 becomes STI 165. An etching depth can be the same as a thickness of the doped upper portion 163 according to some embodiments, but the present disclosure should not be limited thereto. Alternatively, the etching depth can be less than or greater than the thickness of the doped upper portion 163, depending on etching time and/or etching process condition, depth and/or centration of the doped impurities, or combination thereof.

According to some embodiments, wet etching to simultaneously remove the exposed portion of the temporary STI 162 and the patterned oxide layer 121 can be performed by dipping the substrate 100 including various structures formed thereon in a dilute hydrofluoric acid (HF) solution, or a buffered oxide etchant (BOE), or any other suitable etchant. In a case in which a dilute HF solution is selected as an etchant, the volume ratio of $HF:H_2O$ can be about 1:100 or about 1:50, or less or more. An etching time can be about 300 seconds, or less or more. Since the upper portion 163 are doped with impurities including In, Sn, Sb, Te, or a combination thereof, the upper portion 163 of the temporary STI 162 becomes coarser due to collision caused by implantation of the impurities including In, Sn, Sb, Te, or a combination thereof and a change of the binding ability within the temporary STI 162. Thus, the upper portion 163 of the temporary STI 162 becomes much easier to be etched by an etchant than originally undoped temporary STI 162. Accordingly, without increasing the dipping time in a diluted HF solution or any other suitable etchant, a much deeper recess 170 can be formed in the temporary STI 162.

Since the corner portion of the temporary STI 162 is less densified than other portion of the temporary STI 162, an etching rate of the corner portion is higher than the other portion. As a result, as shown in FIG. 10, a V-shape corner groove 169 (or STI divot) remains after dipping the substrate 100 in a diluted HF solution or any other suitable etchant. For convenience, STI 165 is used to denote the remaining portion of the temporary STI 162 after dipping in a diluted HF solution or any other suitable etchant. The STI 165 may contain no impurities including In, Sn, Sb, Te, or a combination thereof when the etching depth of the temporary STI 162 is equal to greater than the doping depth or contain impurities including In, Sn, Sb, Te, or a combination thereof when the etching depth of the temporary STI 162 is less than the doping depth.

As described above, one or more among the patterned oxide layer 121, the patterned first hardmask layer 131, and the patterned second hardmask layer 141 serve as an etching mark layer to form the STI trenches 159 in the process shown in FIG. 5, serve as a polishing stop layer in the process shown in FIG. 7, the patterned oxide layer 121 serve as an ion implantation sacrificial layer to prevent direct damage caused by implantation to the active regions 150 in the ion implantation process shown in FIG. 9, and is removed simultaneously as to form the STI 165 in the process shown in FIG. 10. That is, the ion implantation process uses an existing layer such as the patterned oxide layer 121 as an ion implantation sacrificial layer to prevent damage happened in the active region 150 therebelow and does not require any other additional process. Without significantly increasing manufacturing costs and complexity, material properties of some portion of the temporary STI 162 are modified, thereby facilitating forming a recess in the temporary STI 162 (or removing some portion from the temporary STI 162), in accordance with some embodiments of the present disclosure.

As described above, for example, with reference to FIGS. 9 and 10, the processes including ion implanting into the temporary STI 162 followed by dipping the substrate 100 in an etchant such as a diluted HF solution are used to form the recess 170. The present should not be limited thereto.

According to other embodiments, the recess 170 can be formed dry etching such as RIE undoped temporary STI 162 or temporary STI 162 doped with impurities such as In, Sn, Sb, Te, and a combination thereof. After drying etching, the temporary STI 162 with or without ion implantation becomes coarser and thus becomes much easier to be etched by an etchant such as a diluted HF solution. Accordingly, without increasing the dipping time in HF solution, a much deeper recess in the temporary STI 162 thus can be formed. According to the other embodiments, ion implantation can be omitted.

According to yet other embodiments, a recess formed in a temporary STI can be formed by combining the foregoing processes, or by repeating the foregoing processes such as, but not limiting to, the processes shown in FIGS. 9 and 10.

As shown in FIG. 10, a depth D of the recess 170, defined to be from an upper surface 152 of the active region 150 to a flat upper surface of the remaining STI 165, is about 20 nm to about 50 nm according to some embodiments. By contrast, in a comparative example in which no impurities are doped into a temporary STI while all the other processes are the same, a depth of a recess formed in the temporary STI in the comparative example cannot exceed 20 nm.

Figure 11:
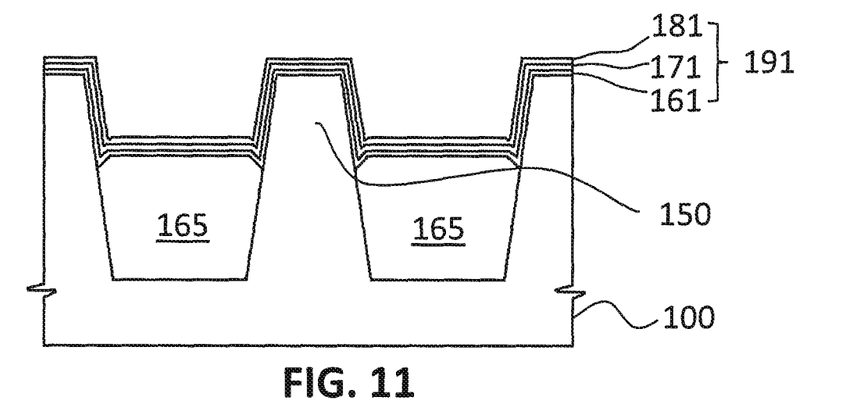

Next, as shown in FIG. 11, an ONO layer 191 including a lower oxide layer 161, a middle nitride layer 171, and an upper oxide layer 181 is sequentially deposited to cover exterior surfaces of the active regions 150 and the STI 165.

Figure 12:
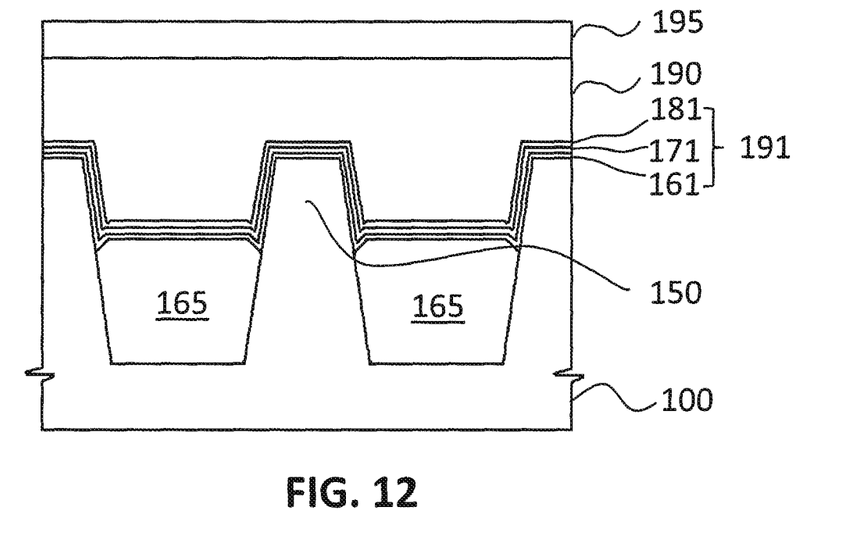

Thereafter, as shown in FIG. 12, a gate electrode layer 190 and an optional silicide layer 195 are formed to cover the ONO layer 191.

It should be appreciated that manufacturing the memory cell according to embodiments of the present disclosure also includes forming wells, drain and source regions, and drain and source electrodes among or before or after the aforementioned processes. These processes are known to ordinary skill in the art and therefore are omitted in the present disclosure.

Figure 13A:
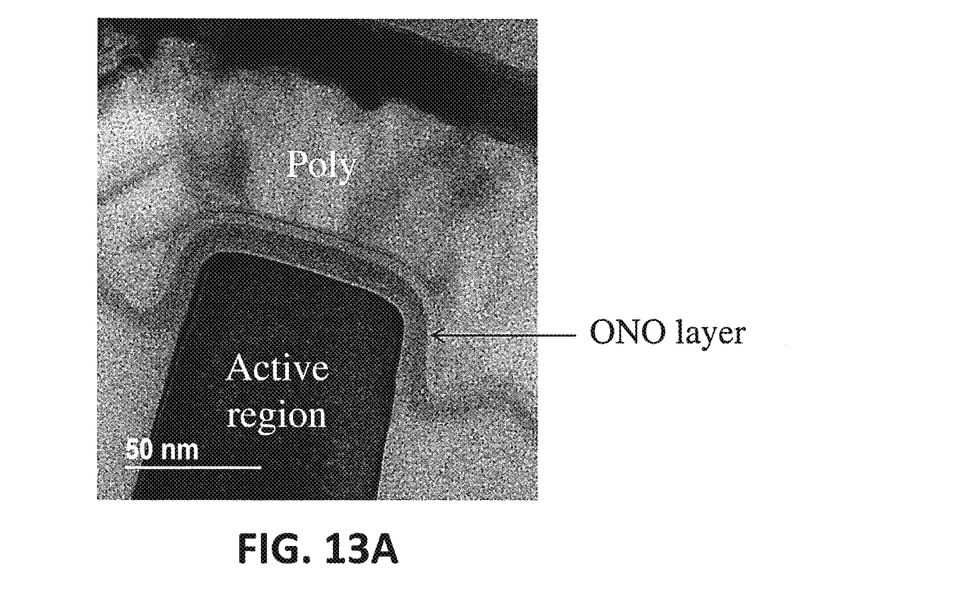
FIG. 13A shows a view of an inventive SONOS memory cell manufactured according to embodiments of the present disclosure, taken along a gate line by a transmission electron microscope (TEM)
Figure 13B:
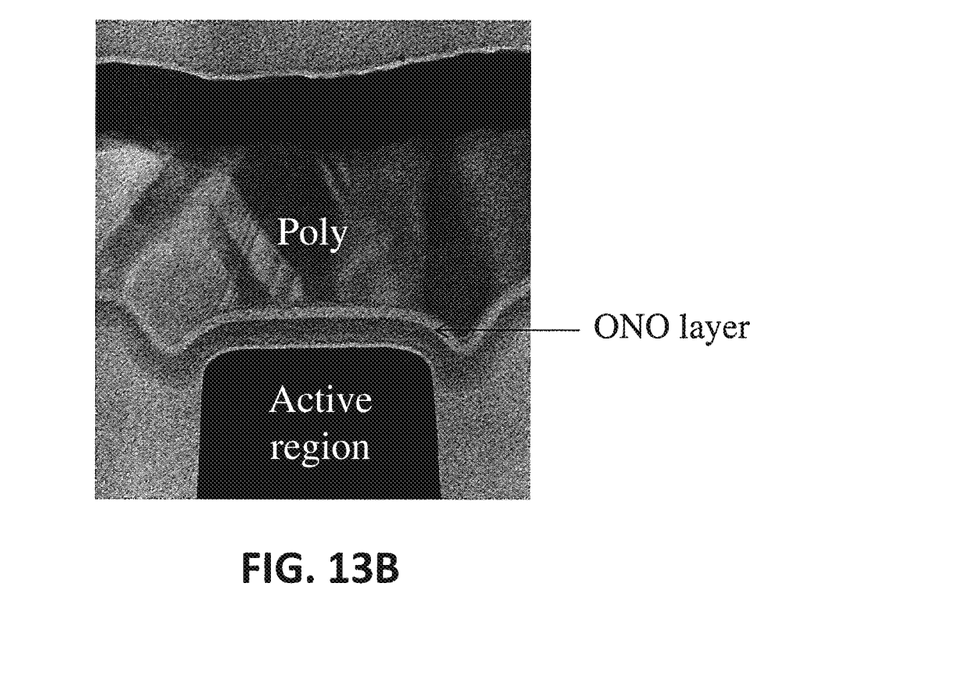
FIG. 13B shows a view of a comparative SONOS memory cell, taken along a gate line by a TEM.

FIG. 13A shows a view of an inventive SONOS memory cell manufactured according to embodiments of the present disclosure, taken along a gate line by a transmission electron microscope (TEM), and FIG. 13B shows a view of a comparative SONOS memory cell, taken along a gate line by a TEM. The manufacturing processes and the layout of the two SONOS memory cells are the same except that the SONOS memory cell manufactured according to embodiments of the present disclosure additionally includes treatment of temporary STI such as ion implantation or RIE prior to forming a recess in the temporary STI. FIGS. 14A-14D show comparisons of performance between the inventive SONOS memory cell manufactured according to embodiments of the present disclosure and the comparative memory cell.

Figures 14A, 14B:
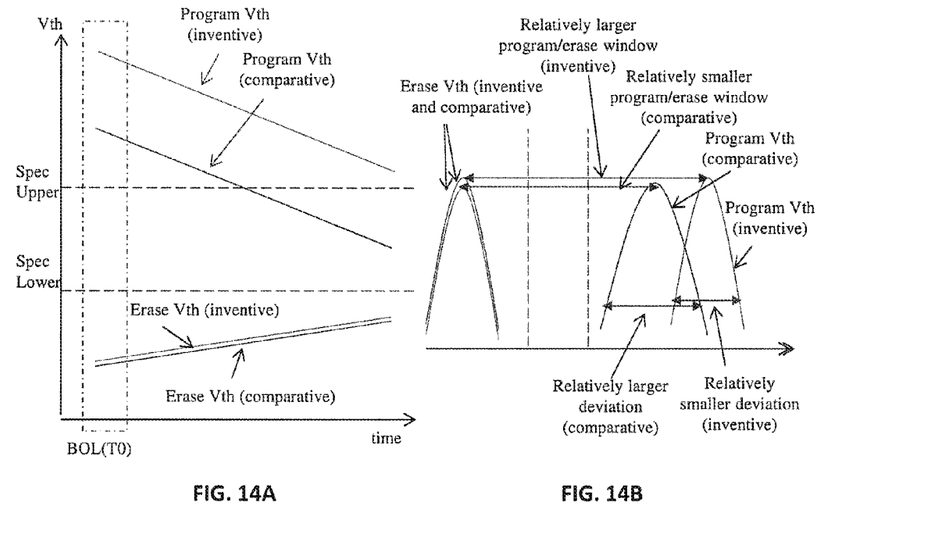
FIGS. 14A-14D show comparisons of performance between the inventive SONOS memory cell manufactured according to embodiments of the present disclosure and the comparative memory cell.
Figure 14C:
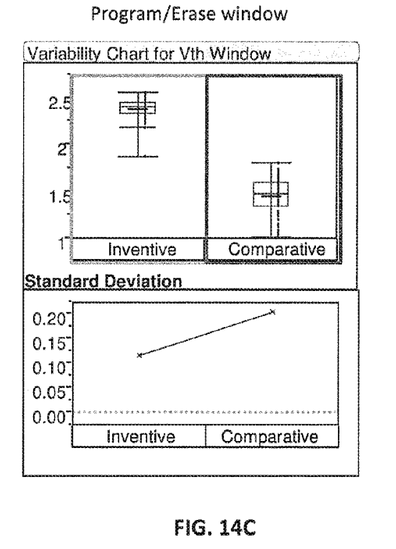
Figure 14D:
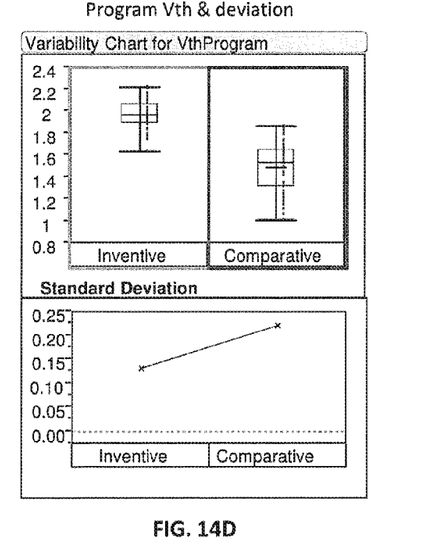

As shown in FIGS. 13A and 13B, the inventive SONOS memory cell manufactured according to embodiments of the present disclosure has a much deeper recess in STI comparing to the comparative SONOS memory. Thus, the inventive SONOS memory cell manufactured according to embodiments of the present disclosure has a relatively larger overlapped area between an ONO layer and an active region as shown in FIGS. 13A and 13B, such that the inventive SONOS memory cell manufactured according to embodiments of the present disclosure has an enlarged begin of life (BOL) operation window and thus end of life (EOL) would also be enlarged as demonstrated in FIGS. 14A and 14B. In addition, as shown in FIGS. 14C and 14D, standard deviation of Vth of the inventive SONOS memory cell manufactured according to embodiments of the present disclosure can be tightened.

The aforementioned processes to form a recess in STI does not require relatively longer dry etching of STI or relatively longer HF (or a relatively higher HF concentration) etching of the STI, but can form a relatively deeper recess in the STI. Thus, any damage to the active regions due to the relatively longer dry etching of the STI or the relatively longer HF (and/or a relatively higher HF concentration) etching of the STI can be avoid.

According to one aspect of the present disclosure, a recess formed in shallow-trench isolation (STI) between adjacent active regions is deepened by the foregoing methods, thereby enlarging program/erase window of the memory cell. The memory cell has an increased overlapped area between the active region and oxide-nitride-oxide layer formed thereon, since the overlapped area is increased by more exposure of the sidewall of the active region by the deepened recess in the STI. The SONOS memory formed by the foregoing methods has an enlarged begin of life (BOL) operation window and thus end of life (EOL) would also be enlarged. Moreover, deviation of Vth (threshold voltage) of SONOS memory cell can be tightened.

One of ordinary skill in the art would recognize that the aforementioned processes to form the recess in STI should not be limited to manufacturing a memory device such as an SONOS memory device. The recess in STI manufactured according to embodiments of the present disclosure may benefit other types of semiconductor devices, since an effective area of an active region can be advantageously increased when side portions of the active region are exposed by deepening a recess in the STI.

According to one aspect of the present disclosure, a method for manufacturing a memory device includes forming trenches in a substrate to define an active region, filling an insulation material in the trenches, treating at least one portion of the insulation material, removing an upper portion of the insulation material from the trenches, so as to expose upper portions of side surfaces of the active region and to convert remaining portions of the insulation material in the trenches to shallow trench isolation (STI) disposed on opposite sides of the active region, forming a lower oxide layer, a middle charge trapping layer, and an upper oxide layer which cover the exposed upper portions of the side surfaces of the active region, an upper surface of the active region between the side surfaces of the active region, and the STI, and forming a gate layer on the upper oxide layer.

According to one aspect of the present disclosure, a method for forming shallow trench isolation (STI) in a substrate includes forming a trench in the substrate, filling an insulation material in the trench, treating at least one portion of the insulation material, and removing an upper portion of the insulation material from the trench, so as to expose upper portions of sidewalls of the trench and to convert a remaining portion of the insulation material in the trench to the shallow trench isolation.

According to one aspect of the present disclosure, a method for forming shallow trench isolation (STI) in a substrate includes forming a pad oxide layer on a surface of the substrate, forming a hardmask layer on the pad oxide layer, patterning the hardmask layer and the pad oxide layer such that the patterned hardmask layer and the patterned pad oxide layer cover one region of the substrate and expose another region of the substrate, forming a trench in the substrate by using the patterned hardmask layer as a trenching mask layer, filling an insulation material in the trench and on the patterned hardmask layer, polishing the insulation material by using the patterned hardmask layer as a polishing stop layer, coarsening one portion of the insulation material, and removing an upper portion of the insulation material from the trench, so as to expose upper portions of sidewalls of the trench and to convert a remaining portion of the insulation material in the trench to the shallow trench isolation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
    forming trenches in a substrate to define an active region;
    filling an insulation material in the trenches;
    treating at least one portion of the insulation material;
    removing an upper portion of the insulation material from the trenches, so as to expose upper portions of side surfaces of the active region and to convert remaining portions of the insulation material in the trenches to shallow trench isolation (STI) disposed on opposite sides of the active region;
    forming a lower oxide layer, a middle charge trapping layer, and an upper oxide layer which cover the exposed upper portions of the side surfaces of the active region, an upper surface of the active region between the side surfaces of the active region, and the STI; and
    forming a gate layer on the upper oxide layer,
    wherein the treating the at least one portion of the insulation material comprises coarsening the at least one portion of the insulation material such that an etching rate of the treated at least one portion of the insulation material is faster than that of an untreated portion of the insulation material under the same etching condition.

2. The method of claim 1, wherein the treating the at least portion of the insulation material comprises implanting impurities into the insulation material.

3. The method of claim 2, wherein the impurities include In, Sn, Sb, Te, or a combination thereof.

4. The method of claim 2, wherein the removing the upper portion of the insulation material from the trenches comprises dipping the substrate including the insulation material in an etchant which etches the insulation material faster than any other materials on exterior surfaces of the substrate.

5. The method of claim 1, wherein the treating the at least one portion of the insulation material comprises reactive ion etching (RIE) the at least one portion of the insulation material.

6. The method of claim 5, wherein the removing the upper portion of the insulation material from the trenches comprises dipping the substrate including the insulation material in an etchant which etches the insulation material faster than any other materials on exterior surfaces of the substrate.

7. The method of claim 1, further comprising, prior to forming the trenches in the substrate:
    forming a pad oxide layer on a surface of the substrate;
    forming a first hardmask layer on the pad oxide layer;
    patterning the first hardmask layer and the pad oxide layer such that the patterned first hardmask layer and the patterned pad oxide layer cover the active region and expose regions in which the trenches are formed; and,
    polishing the insulation material using the first hardmask as a polishing stop layer.

8. The method of claim 7, wherein during the removing of the upper portion of the insulation material from the trenches, the patterned pad oxide layer is simultaneously removed.

9. The method of claim 7, wherein the first hardmask layer is a silicon nitride layer.

10. The method of claim 1, further comprising, prior to forming the trenches in the substrate:
    forming a pad oxide layer on a surface of the substrate;
    forming a first hardmask layer on the pad oxide layer; and
    forming a second hardmask layer on the first hardmask layer; and patterning the second hardmask layer, the first hardmask layer, and the pad oxide layer, such that the patterned second hardmask layer, the patterned first hardmask layer, and the patterned pad oxide layer cover the active region and expose regions in which the trenches are formed.

11. The method of claim 1, wherein:
the insulation material is silicon oxide, and
the removing the upper portion of the insulation material from the trenches comprises dipping the substrate including the insulation material in a solution containing hydrofluoric acid (HF).

12. The method of claim 1, further comprising:
after the filling the insulation material in the trenches and before treating at least the portion of the insulation material, polishing the insulation material to planarize the insulation material.

13. The method of claim 1, wherein a distance from the upper surface of the active region to the STI is about 20 nm to about 50 nm.

14. A method for forming shallow trench isolation (STI) in a substrate, comprising:
forming a trench in the substrate;
filling an insulation material in the trench;
treating at least one portion of the insulation material; and
removing an upper portion of the insulation material from the trench, so as to expose upper portions of sidewalls of the trench and to convert a remaining portion of the insulation material in the trench to the STI,
wherein the treating the at least portion of the insulation material comprises implanting impurities including In, Sn, Sb, Te, or a combination thereof into the insulation material.

15. The method of claim 14, wherein no annealing is performed after the implantation of the impurities including In, Sn, Sb, Te, or a combination thereof into the insulation material and before the removal of the upper portion of the insulation material from the trench.

16. The method of claim 14, wherein the treating the at least one portion of the insulation material comprises reactive ion etching (RIE) the at least one portion of the insulation material.

17. A method for forming shallow trench isolation (STI) in a substrate, comprising:
forming a pad oxide layer on a surface of the substrate;
forming a hardmask layer on the pad oxide layer;
patterning the hardmask layer and the pad oxide layer such that the patterned hardmask layer and the patterned pad oxide layer cover one region of the substrate and expose another region of the substrate;
forming a trench in the substrate by using the patterned hardmask layer as a trenching mask layer;
filling an insulation material in the trench and on the patterned hardmask layer;
polishing the insulation material by using the patterned hardmask layer as a polishing stop layer;
coarsening one portion of the insulation material; and
removing an upper portion of the insulation material from the trench, so as to expose upper portions of sidewalls of the trench and to convert a remaining portion of the insulation material in the trench to the STI.

18. The method of claim 17, wherein the treating the at least portion of the insulation material comprises implanting impurities including In, Sn, Sb, Te, or a combination thereof into the insulation material or reactive ion etching (RIE) the at least one portion of the insulation material.

* * * * *